(12) United States Patent
Shiah

(10) Patent No.: US 9,773,533 B2
(45) Date of Patent: Sep. 26, 2017

(54) MEMORY WITH LOW CURRENT CONSUMPTION AND METHOD FOR REDUCING CURRENT CONSUMPTION OF A MEMORY

(71) Applicant: Etron Technology, Inc., Hsinchu (TW)

(72) Inventor: Chun Shiah, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 1 day.

(21) Appl. No.: 14/297,645

(22) Filed: Jun. 6, 2014

(65) Prior Publication Data

US 2014/0362656 A1    Dec. 11, 2014

Related U.S. Application Data

(60) Provisional application No. 61/831,623, filed on Jun. 6, 2013.

(51) Int. Cl.
*G11C 5/14* (2006.01)
*G11C 7/00* (2006.01)
(Continued)

(52) U.S. Cl.
CPC .................. *G11C 7/12* (2013.01); *G11C 7/06* (2013.01); *G11C 8/08* (2013.01); *G11C 8/12* (2013.01); *G11C 8/18* (2013.01); *G11C 11/4085* (2013.01); *G11C 11/4091* (2013.01); *G11C 11/4094* (2013.01); *G11C 2207/229* (2013.01); *G11C 2207/2281* (2013.01)

(58) Field of Classification Search
CPC ......... G11C 8/08; G11C 7/12; G11C 11/4085; G11C 11/4094; G11C 11/4096; G11C 11/4091; G11C 8/12; G11C 8/18; G11C 7/06; G11C 2207/06; G11C 2207/2281; G11C 2207/229
See application file for complete search history.

(56) References Cited

U.S. PATENT DOCUMENTS 5,345,573 A * 9/1994 Bowden, III ........... G06F 13/28
                                                    365/189.02
5,636,173 A * 6/1997 Schaefer ............... G11C 7/1072
                                                    365/189.05
(Continued)

FOREIGN PATENT DOCUMENTS

CN        1037983 A    12/1989

*Primary Examiner* — Kretelia Graham
(74) *Attorney, Agent, or Firm* — Winston Hsu

(57) ABSTRACT

A method for reducing current consumption of a memory is disclosed, wherein the memory includes a controller and a plurality of banks, and each bank of the plurality of banks includes a plurality of segments. The method includes the controller enabling an activating command corresponding to a first row address and an address of a first bank of the plurality of banks; a word line switch of a segment of the first bank corresponding to the first row address being turned on according to the activating command; the controller enabling an access command corresponding to an address of the segment; a plurality of bit switches corresponding to the segment being turned on according to the access command; and the controller enabling a pre-charge command corresponding to an address of a following segment and the address of the first bank after the access command is disabled.

10 Claims, 2 Drawing Sheets

(51) Int. Cl.
*G11C 8/00* (2006.01)
*G11C 7/12* (2006.01)
*G11C 8/08* (2006.01)
*G11C 11/4091* (2006.01)
*G11C 8/18* (2006.01)
*G11C 7/06* (2006.01)
*G11C 11/4094* (2006.01)
*G11C 11/408* (2006.01)
*G11C 8/12* (2006.01)

(56) References Cited

U.S. PATENT DOCUMENTS

| | | | | |
|---|---|---|---|---|
| 6,426,909 B1* | 7/2002 | Tomita | ............... | G11C 11/406 365/222 |
| 6,459,647 B1* | 10/2002 | Kengeri | ............... | G11O 5/063 365/194 |
| 2003/0198119 A1* | 10/2003 | Jones, Jr. | ............. | G11C 7/1042 365/230.03 |
| 2005/0152211 A1* | 7/2005 | Henmi | ................ | G09G 5/363 365/52 |
| 2008/0059822 A1* | 3/2008 | Choi | .................. | G06F 1/3203 713/320 |
| 2008/0080261 A1* | 4/2008 | Shaeffer | ............. | G11C 5/025 365/189.05 |

* cited by examiner

MEMORY WITH LOW CURRENT CONSUMPTION AND METHOD FOR REDUCING CURRENT CONSUMPTION OF A MEMORY

CROSS REFERENCE TO RELATED APPLICATIONS

This application claims the benefit of U.S. Provisional Application No. 61/831,623, filed on Jun. 6, 2013 and entitled "Memory array architecture for current reduction," the contents of which are incorporated herein by reference.

BACKGROUND OF THE INVENTION

1. Field of the Invention

The present invention relates to a memory and an operation method of a memory, and particularly to a memory with low current consumption and a method for reducing current consumption of a memory.

2. Description of the Prior Art

In the prior art, when an application unit coupled to a memory needs to access data stored in a predetermined segment of a bank of the memory, a controller of the memory first enables an active command corresponding to a predetermined row address of the bank, and then enables an access command. Therefore, a plurality of word line switches of all segments of the bank corresponding to the predetermined row address are turned on according to the active command, and a plurality of bit switches and sensing amplifier groups corresponding to the all segments of the bank are also turned on according to the access command. Although the application unit only needs to access the data stored in the predetermined segment of the bank, the plurality of word line switches of all segments of the bank corresponding to the predetermined row address and the plurality of bit switches and the sensing amplifier groups bank corresponding to the all segments of the bank are all turned on, resulting in the memory wasting some unnecessary current consumption.

SUMMARY OF THE INVENTION

An embodiment provides a method for reducing current consumption of a memory, wherein the memory includes a controller, a plurality of banks, and a plurality of registers, and each bank of the plurality of banks includes a plurality of segments and corresponds to a register of the plurality of registers. The method includes the controller enabling an active command corresponding to an address of a first bank of the plurality of banks and a first row address; s a word line switch of a segment of the first bank corresponding to the first row address being turned on according to the active command; the controller enabling an access command corresponding to an address of the segment; a plurality of bit switches corresponding to the segment being turned on according to the access command; and the controller enabling a pre-charge command corresponding to an address of a following segment and the address of the first bank after the access command is disabled.

Another embodiment provides a memory with low current consumption. The memory includes a plurality of banks and a controller. Each bank of the plurality of banks includes a plurality of segments. The controller enables and disables an active command corresponding to an address of a first bank of the plurality of banks and a first row address, an access command corresponding to an address of a segment of the first bank, and a pre-charge command corresponding to an address of a following segment and the address of the first bank. When the active command is enabled, a word line switch of the segment corresponding to the first row address is turned on according to the active command, and when the access command is enabled, a plurality of bit switches corresponding to the segment are turned on according to the access command.

Another embodiment provides a memory with low current consumption. The memory includes N of banks and a controller. Each bank of the N banks includes a plurality of segments, and N is an integer greater than 1. The controller generates a pre-charge command corresponding to an address of an $m^{th}$ segment of a following $n^{th}$ bank and an address of a first bank, wherein n is an integer between 1 and N, and m is an integer greater than 1. The address of the $m^{th}$ segment of the $n^{th}$ bank is store in a corresponding register.

The present invention provides a method for reducing current consumption of a memory and a memory with low current consumption. The method and the memory utilize a controller to first generate a pre-charge command corresponding to an address of a predetermined segment and an address of a predetermined bank before the controller generates an active command and an access command when an application unit coupled to the memory needs to access data stored in the predetermined segment of the predetermined bank of the memory. Thus, because only a word line switch corresponding to a word line of the predetermined segment, a plurality of bit switches corresponding to the predetermined segment, and sensing amplifier groups corresponding to the predetermined segment in the predetermined bank are turned on after the controller generates the active command and the access command, compared to the prior art, the method and the memory provided by the present invention can reduce current consumption of the memory.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
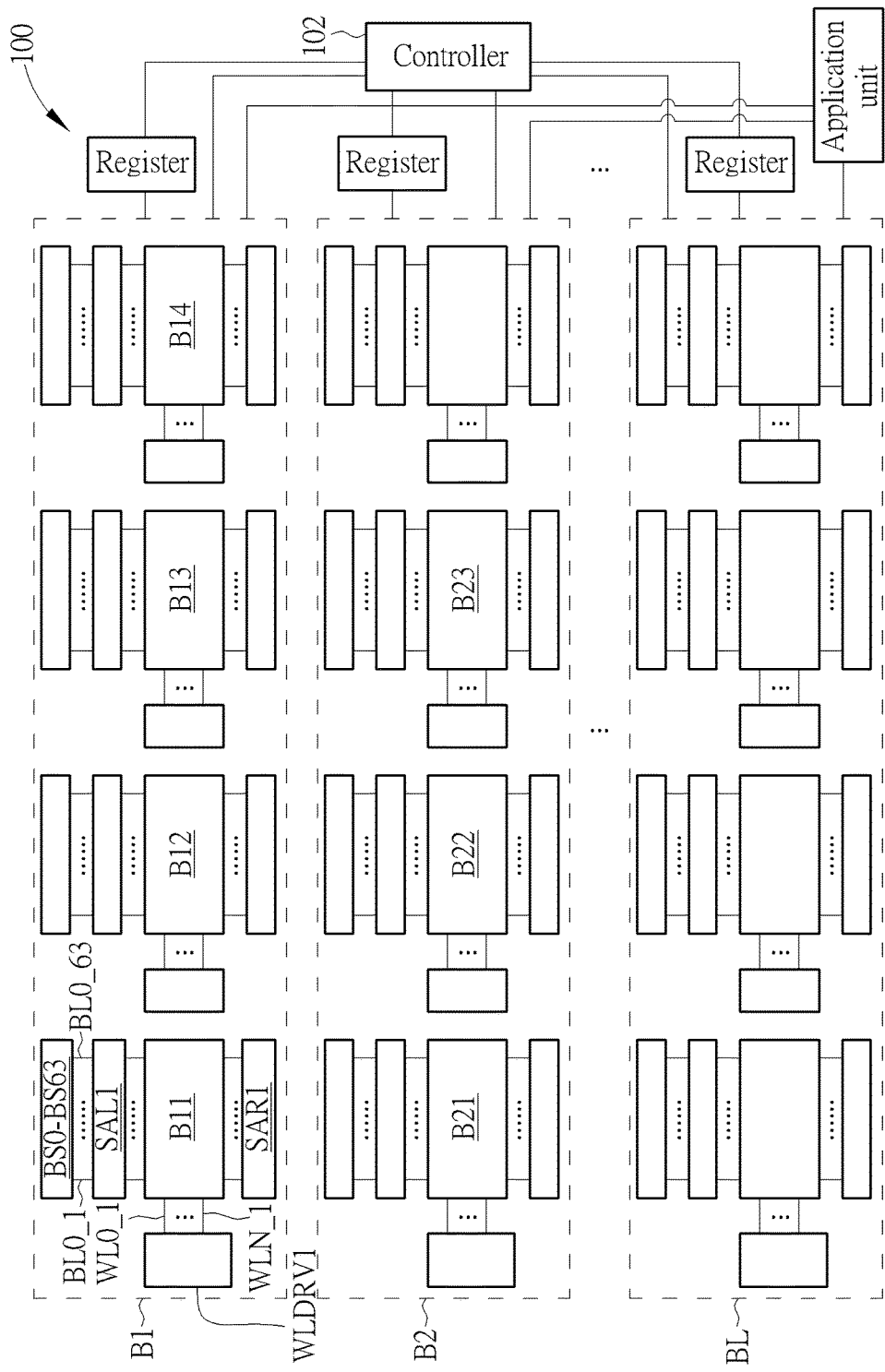
FIG. 1 is a diagram illustrating a memory with low current consumption according to an embodiment.

Please refer to FIG. 1. FIG. 1 is a diagram illustrating a memory 100 with low current consumption according to an embodiment. As shown in FIG. 1, the memory 100 includes L banks B1-BL and a controller 102, wherein L is a positive integer, each bank of the L banks B1-BL includes a plurality of segments. For example, the bank B1 includes 4 segments B11-B14. But, the present invention is not limited to the bank B1 including the 4 segments B11-B14. As shown in FIG. 1, the segment B11 corresponds to N word lines WL0_1-WLN_1, sensing amplifier groups SAL1, SAR1, and 64 bit switches BS0-BS63, wherein N is a positive integer, each bit switch of the 64 bit switches BS0-BS63 is coupled to a corresponding bit line of bit lines BL0_1-BL0_63, N word lines WL0_1-WLN_1 are coupled to a word line driving unit WLDRV1, sensing amplifier groups SAL1, SAR1 are coupled to the bit lines BL0_1-BL0_63 and the 64 bit switches BS0-BS63, and each of the sensing amplifier groups SAL1, SAR1 has 64 sensing amplifiers corresponding to the 64 bit switches BS0-BS63. But, the present invention is not limited to the segment B11 corresponding to the 64 bit switches BS0-BS63, that is, the segment B11 can correspond to a plurality of bit switches. In addition, each segment of the segments B12-B14 is the same as the segment B11, so further description thereof is omitted for simplicity.

When an application unit (not shown in FIG. 1) coupled to the memory 100 needs to access data stored in the segment B11 of the bank B1, the controller 102 first enables an active command corresponding to an address of the bank B1 and a first row address (e.g. corresponding to a word line WLN_1, and then a word line switch (corresponding to the word line WLN_1) corresponding to the first row address can be turned on according to the active command after the controller 102 enables the active command. After the controller 102 enables the active command, the controller 102 enables an access command corresponding to the address of the bank B1 and an address of the segment B11, and then the 64 bit switches BS0-BS63 corresponding to the segment B11 can be turned on according to the access command after the controller 102 enables the access command, wherein the access command is a read/write command. When the 64 bit switches BS0-BS63 corresponding to the segment B11 are turned on according to the access command, the application unit coupled to the memory 100 can access data stored in the segment B11 corresponding to the first row address and the 64 bit switches BS0-BS63 through the sensing amplifier groups SAL1, SAR1 corresponding to the segment B11. Therefore, because when the application unit coupled to the memory 100 needs to access the data stored in the segment B11 of the bank B1, only the word line switch corresponding to the word line WLN_1, the 64 bit switches BS0-BS63, and the sensing amplifier groups SAL1, SAR1 are turned on in the bank B1, current consumption of the memory 100 can be reduced when the memory 100 is accessed.

In addition, after the controller 102 disables the access command, the controller 102 can enable a pre-charge command corresponding to an address of a following segment and the address of the bank B1 of the memory 100, wherein the address of the following segment corresponds to a second bank of the memory 100, the second bank is different from the bank B1, and a register corresponding to the second bank can store the address of the following segment and an address of the second bank. But, in another embodiment of the present invention, the address of the following segment corresponds to the bank B1 of the memory 100. After the controller 102 disables the pre-charge command, the controller 102 can enable an active command corresponding to an address of a third bank (e.g. the bank B2) and a second row address when the application unit coupled to the memory 100 needs to access data stored in a segment (e.g. the segment B21) of the third bank (e.g. the bank B2), and then the controller 102 can execute the above mentioned steps corresponding to accessing the bank B1 again, so further description thereof is omitted for simplicity, wherein the segment (e.g. the segment B21) of the third bank (e.g. the bank B2) has been pre-charged by a previous pre-charge command. In addition, subsequent operational principles of each bank of the banks B2-BN are the same as those of the bank B1, so further description thereof is omitted for simplicity.

In addition, please refer to TABLE 1. TABLE 1 is used for illustrating operation of the application unit coupled to the memory 100 accessing the memory 100.

TABLE 1 active command 1 (e.g. corresponding to the address of the bank B1, and for turning on a word line switch corresponding to a word line (e.g. corresponding to the first row address) of the segment B11, not for turning on word line switches of the bank B1 corresponding to the word line (e.g. corresponding to the first row address), wherein the address of the segment B11 is a default or previously stored in a register corresponding to the bank B1)
access command 1 (e.g. corresponding to the address of the bank B1)
pre-charge command 1 (for pre-charging the address of the bank B1 and an address of a following segment (e.g. an address of a segment B21 of the bank B2))
active command 2 (e.g. corresponding to the address of the bank B2, and for turning on a word line switch corresponding to a word line (e.g. corresponding to the first row address) of the segment B21, not for turning on word line switches of the bank B2 corresponding to the word line (e.g. corresponding to the first row address), wherein the address of the segment B21 can be obtained from the address of the segment B21 of the bank B2 stored in a register corresponding to the bank B2 after the pre-charge command 1 is disabled)
access command 2 (e.g. corresponding to the address of the bank B2)
pre-charge command 2 (for pre-charging the address of the bank B2 and an address of a following segment (e.g. an address of a segment B22 of the bank B2))
active command 3 (e.g. corresponding to an address of the bank BL, and for turning on a word line switch corresponding to a word line (e.g. corresponding to the first row address) of the segment BLX, not for turning on word line switches of the bank BL corresponding to the word line (e.g. corresponding to the first row address), wherein an address of the segment BLX is a default or previously stored in a register corresponding to the bank BL)
access command 3 (e.g. corresponding to the address of the bank BL)
pre-charge command 3 (for pre-charging the address of the bank BL and an address of a following segment (e.g. an address of a segment B23 of the bank B2), meanwhile, the address of the segment B22 of the bank B2 previously stored in the register corresponding to the bank B2 can be update by the address of the segment B23 of the bank B2)

As shown in TABLE 1, because the pre-charge command 1 corresponds to the address of the bank B1 and an address of a following segment (e.g. the segment B21 corresponding to the bank B2), the bank B1 and the segment B21 corresponding to the bank B2 can be charged according to the pre-charge command 1. Therefore, when the controller enables the active command 2 (corresponding to the address of the bank B2 and the first row address) and the access command 2 (corresponding to the address of the bank B2 and the address of the segment B21), only a word line switch corresponding to the first row address, 64 bit switches and sensing amplifier groups corresponding to the segment B21 are turned on in the bank B2. In addition, a bank corresponding to an active command can be or different from a bank corresponding to a following segment of a previous pre-charge command. For example, the bank B2 corresponds to the active command 2, and the bank B2 also corresponds to the following segment of the pre-charge command 1; and the bank BL corresponds to the active command 3 and the bank B2 corresponds to the following segment of the pre-charge command 2.

Figure 2:
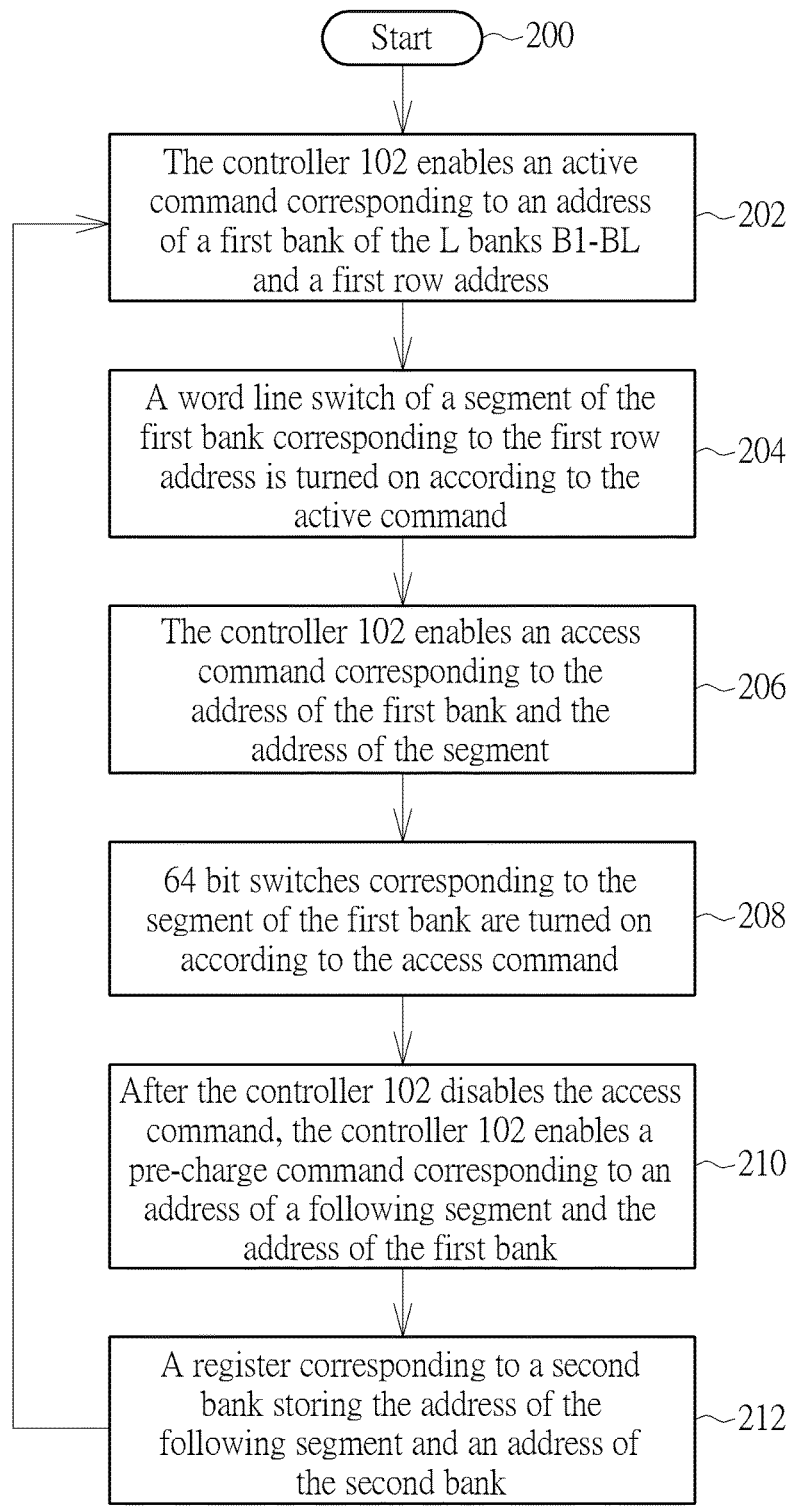
FIG. 2 is a flowchart illustrating a method for reducing current consumption of a memory according to another embodiment.

Please refer to FIG. 1 and FIG. 2. FIG. 2 is a flowchart illustrating a method for reducing current consumption of a memory according to another embodiment. The method in FIG. 2 is illustrated using the memory 100 in FIG. 2. Detailed steps are as follows:

Step 200: Start.

Step 202: The controller 102 enables an active command corresponding to an address of a first bank of the L banks B1-BL and a first row address.

Step 204: A word line switch of a segment of the first bank corresponding to the first row address is turned on according to the active command.

Step 206: The controller 102 enables an access command corresponding to the address of the first bank and the address of the segment.

Step 208: 64 bit switches corresponding to the segment of the first bank are turned on according to the access command.

Step 210: After the controller 102 disables the access command, the controller 102 enables a pre-charge command corresponding to an address of a following segment and the address of the first bank.

Step 212: A register corresponding to a second bank storing the address of the following segment and an address of the second bank, go to Step 202.

In Step 202, when the application unit (not shown in FIG. 1) coupled to the memory 100 needs to access data stored in a segment (e.g. the segment B11) of the first bank (e.g. the bank B1) of the L banks B1-BL, the controller 102 first enables the active command corresponding to the address of the bank B1 and the first row address (e.g. corresponding to the word line WLN_1). In Step 204, after the controller 102 enables the active command, the word line switch of the segment B11 (corresponding to the word line WLN_1) corresponding to the first row address can be turned on according to the active command. In Step 206, after the controller 102 enables the active command, the controller 102 enables the access command corresponding to the address of the bank B1 and the address of the segment B11. In Step 208, after the controller 102 enables the access command, the 64 bit switches BS0-BS63 corresponding to the segment B11 can be turned on according to the access command, wherein the access command is a read/write command. When the 64 bit switches BS0-BS63 corresponding to the segment B11 are turned on according to the access command, the application unit coupled to the memory 100 can access data stored in the segment B11 corresponding to the first row address (corresponding to the word line WLN_1) and the 64 bit switches BS0-BS63 through the sensing amplifier groups SAL1, SAR1 corresponding to the segment B11. Therefore, because when the application unit (not shown in FIG. 1) coupled to the memory 100 needs to access the data stored in the segment B11 of the bank B1, only the word line switch corresponding to the word line WLN_1, the 64 bit switches BS0-BS63, and the sensing amplifier groups SAL1, SAR1 in the bank B1 are turned on, current consumption of the memory 100 can be reduced when the memory 100 is accessed.

In addition, in Step 210, after the controller 102 disables the access command, the controller 102 can enable the pre-charge command corresponding to the address of the following segment and the address of the first bank of the memory 100, wherein the address of the following segment corresponds to the second bank of the memory 100, and the second bank is different from the first bank (the bank B1). In Step 212, the register corresponding to the second bank can store the address of the following segment and the address of the second bank. But, in another embodiment of the present invention, the address of the following segment corresponds to the first bank of the memory 100. That is to say, after the controller 102 disables the pre-charge command, the controller 102 can enable an active command corresponding to an address of a third bank (e.g. the bank B2) and a second row address when the application unit coupled to the memory 100 needs to access data stored in a segment (e.g. the segment B21) of the bank B2, and then the controller 102 can execute the above mentioned steps corresponding to accessing the bank B1 again, so further description thereof is omitted for simplicity, wherein the segment (e.g. the segment B21) of the third bank (e.g. the bank B2) has been pre-charged by a previous pre-charge command.

To sum up, the method for reducing current consumption of a memory and the memory with low current consumption utilize the controller to first generate a pre-charge command corresponding to an address of a predetermined segment and an address of a predetermined bank before the controller generates an active command and an access command when the application unit coupled to the memory needs to access data stored in the predetermined segment of the predetermined bank of the memory. Thus, because only a word line switch corresponding to a word line of the predetermined segment, a plurality of bit switches corresponding to the predetermined segment, and sensing amplifier groups corresponding to the predetermined segment in the predetermined bank are turned on after the controller generates the active command and the access command, compared to the prior art, the method and the memory provided by the present invention can reduce current consumption of the memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reducing current consumption of a memory, wherein the memory comprises a controller, a plurality of banks, and a plurality of registers, and each bank of the plurality of banks comprises a plurality of segments and the each bank corresponds to a register of the plurality of registers, the method comprising:

the controller enabling an active command corresponding to an address of a first bank of the plurality of banks and a first row address;

a word line switch of a segment of the first bank corresponding to the first row address being turned on according to the active command;

the controller enabling an access command corresponding to an address of the segment;

a plurality of bit switches and sensing amplifier groups corresponding to the segment being turned on according to the access command; and the controller only enabling a pre-charge command corresponding to an address of a following segment of a following bank and an address of the first bank, rather than corresponding to all segments of the following bank after the access command is disabled, wherein the address of the following segment of the following bank or the address of the first bank is stored in a corresponding register.

2. The method of the claim 1, wherein the access command is a read/write command, and the access command further corresponds to the address of the first bank.

3. The method of the claim 1, further comprising:

the controller disabling the pre-charge command after the following segment is pre-charged; and after the pre-charge command is disabled, the controller enabling an active command corresponding to an address of a third bank and a second row address.

4. The method of the claim 1, wherein when the plurality of bit switches corresponding to the segment are turned on according to the access command, an application unit coupled to the memory accesses data stored in the segment corresponding to the first row address and the plurality of bit switches through the sensing amplifier groups corresponding to the segment.

5. A memory with low current consumption, comprising:
   a plurality of banks, wherein each bank of the plurality of banks comprises a plurality of segments; and
   a controller enabling and disabling an active command corresponding to an address of a first bank of the plurality of banks and a first row address, an access command corresponding to an address of a segment of the first bank, and only enabling a pre-charge command corresponding to an address of a following segment of a following bank and an address of the first bank, rather than corresponding to all segments of the following bank, instead of enabling a pre-charge command corresponding to the all plurality of banks, wherein the address of the following segment of the following bank or the address of the first bank is stored in a corresponding register;
   wherein when the active command is enabled, a word line switch of the segment corresponding to the first row address is turned on according to the active command, and when the access command is enabled, a plurality of bit switches and sensing amplifier groups corresponding to the segment are turned on according to the access command.

6. The memory of claim 5, wherein the access command is a read/write command, and the access command further corresponds to the address of the first bank.

7. The memory of claim 5, wherein the controller further disables the pre-charge command after the following segment is pre-charged, and enables an active command corresponding to an address of a third bank and a second row address after the pre-charge command is disabled.

8. The memory of claim 5, wherein when the plurality of bit switches corresponding to the segment are turned on according to the access command, an application unit coupled to the memory accesses data stored in the segment corresponding to the first row address and the plurality of bit switches through the sensing amplifier groups corresponding to the segment.

9. A memory with low current consumption, comprising:
   N banks, wherein each bank of the N banks comprises a plurality of segments, and N is an integer greater than 1; and
   a controller, before generating an active command and an access command, first generating a pre-charge command corresponding to an address of a predetermined segment of a following bank of the N bank and an address of a predetermined bank of the N bank, wherein the predetermined bank is currently accessed and the predetermined segment of the following bank is next accessed;
   wherein the address of the predetermined segment or the predetermined bank is stored in a corresponding register.

10. The memory of the claim 9, wherein when the controller generates an active command to the predetermined segment, the controller turns on a word line switch corresponding to a word line of the predetermined segment according to the address of the predetermined segment stored in the corresponding register.

* * * * *